United States Patent
Scherer et al.

(10) Patent No.: US 8,318,265 B2
(45) Date of Patent: Nov. 27, 2012

(54) PLASMA MEDIATED PROCESSING OF NON-CONDUCTIVE SUBSTRATES

(75) Inventors: Brian Joseph Scherer, Greenwood Lake, NY (US); Ahmet Gun Erlat, Clifton Park, NY (US); Min Yan, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 1203 days.

(21) Appl. No.: 12/137,816

(22) Filed: Jun. 12, 2008

(65) Prior Publication Data

US 2009/0311444 A1    Dec. 17, 2009

(51) Int. Cl.
    *H05H 1/24* (2006.01)
(52) U.S. Cl. ......... 427/533; 427/534; 427/535; 427/250
(58) Field of Classification Search ............... 427/533, 427/534, 535, 250
    See application file for complete search history.

(56) References Cited

U.S. PATENT DOCUMENTS

| 4,464,416 | A * | 8/1984 | Liepins ..................... 427/576 |
| 5,156,716 | A | 10/1992 | Parthasarathi |
| 5,702,770 | A | 12/1997 | Martin |
| 5,916,401 | A | 6/1999 | Gannon |
| 6,416,938 | B1 * | 7/2002 | Kubacki ..................... 430/323 |
| 7,025,867 | B2 | 4/2006 | Czeczka et al. |
| 7,282,255 | B2 | 10/2007 | Hiranaka et al. |
| 7,361,869 | B2 | 4/2008 | Russegger |
| 7,632,550 | B2 * | 12/2009 | Mizuno et al. ................ 427/576 |
| 7,825,582 | B2 * | 11/2010 | Furukawa et al. ............ 313/504 |
| 2002/0127431 | A1 * | 9/2002 | Ueda et al. ..................... 428/690 |
| 2003/0184227 | A1 * | 10/2003 | Fujiwara ....................... 313/584 |
| 2004/0094705 | A1 * | 5/2004 | Wood et al. ................... 250/288 |
| 2004/0144314 | A1 * | 7/2004 | David et al. ................... 118/718 |
| 2004/0197488 | A1 * | 10/2004 | Kubacki ........................ 427/489 |
| 2006/0110933 | A1 * | 5/2006 | Shimosawa ................... 438/778 |
| 2007/0231648 | A1 * | 10/2007 | Han et al. ........................ 429/30 |
| 2008/0023691 | A1 | 1/2008 | Jang et al. |
| 2008/0248215 | A1 * | 10/2008 | Sauer et al. ................... 427/534 |
| 2011/0226728 | A1 * | 9/2011 | Blom et al. ...................... 216/13 |

FOREIGN PATENT DOCUMENTS

EP            1 777 997 A1    4/2007

OTHER PUBLICATIONS

Niino, Fumihito, et al., "Deposition of low-resistivity ITO on plastic substrates by DC arc-discharge ion plating." Thin Solid Films 411 (2002), pp. 28-31.*

(Continued)

*Primary Examiner* — Bret Chen
(74) *Attorney, Agent, or Firm* — Mary Louise Stanford (57) ABSTRACT

Methods for improving coating or etching uniformity of non-conductive substrates in plasma-mediated processes generally include applying an electrically conductive coating to the non-conductive substrate prior to plasma processing. The electrically conductive coating is disposed in electrical communication with a metallic electrode of a plasma reactor. By disposing a conductive layer on the non-conductive substrate, a uniform electric potential is created during plasma processing can be built up on the non-conductive, which is equivalent to that of the metallic electrode upon which it is disposed during plasma processing.

23 Claims, 4 Drawing Sheets

OTHER PUBLICATIONS

Al-Dahoudi, N., et al., "Transparent conducting, anti-static and anti-static—anti-glare coatings on plastic substrates." Thin Solid Films 392 (2001), pp. 299-304.*

Hong, Yongtaek, et al., "Transparent Flexible Plastic Substrates for Organic Light-Emitting Devices". Journal of Electronic Materials, vol. 33, No. 4, 2004, pp. 312-320.*

Liu, Day-Shan, et al., "Adhesion enhancement of hard coatings deposited on flexible plastic substrates using an interfacial buffer layer". J. Phys. D: Appl. Phys. 43 (2010) 175301, pp. 1-10.*

Carcia, P.F., et al., Gas diffusion ultrabarriers on polymer substrates using Al2O3 atomic layer deposition and SiN plasma-enhanced chemical vapor deposition. Journal of Applied Physics 106, 023533 (2009), pp. 1-6.*

* cited by examiner

PLASMA MEDIATED PROCESSING OF NON-CONDUCTIVE SUBSTRATES

BACKGROUND

Plastic substrates are widely used in the fabrication of electronic devices, particularly in the microelectronic industry, due to advantages over glass substrates. Some of these advantages include flexibility, lighter weight, thinness, and robustness. Other advantages to the use of plastic substrates include good processability and impact resistance, making it an attractive substrate for an endless variety of applications.

However, one disadvantage to the use of plastics in an application can be relatively low surface hardness and ease of being scratched. This may particularly pose a problem in applications that require good transparency. Electronic devices with plastic substrates have another disadvantage relating to oxygen and moisture diffusion—plastic substrates are generally not impervious to oxygen and water vapor, and thus may not be suitable for the manufacture of certain devices such as organic light-emitting diodes (OLEDs), which may otherwise benefit from properties of the plastic.

In order to improve the resistance of these substrates to oxygen and water vapor, coatings comprising ceramic materials have been applied to a surface of the plastic substrate. Plasma assisted coating and etching processes have been widely used in the microelectronic industry, particularly in the semiconductor manufacturing industry to deposit films onto wafers or other temperature-sensitive structures. One reason for use of plasma assisted coating and etching processes is that plasmas are capable of efficiently generating chemically active species. Second, plasma can generate ions and accelerate the ions to energies of 50-1000 eV in the vicinity of the deposition or etching substrate. Plasma assisted deposition can add impermeability and/or gas-barrier properties to a substrate, and can be useful for the protection of plastics against scratching and abrasion. Such processes including plasma enhanced chemical vapor deposition (PECVD), plasma assisted evaporation, plasma assisted atomic layer deposition (ALD), reactive ion etching (RIE), and the like. Often these coatings deposited by such processes are of a "silica" type.

However, there can be certain technical challenges associated with plasma assisted coating and etching processes on plastic substrates. For example, plastic substrates typically have a relatively high coefficient of thermal expansion (CTE) compared to a metal electrode employed in the plasma reactor. A material's CTE indicates its expansion and contraction properties as a function of temperature. Furthermore, plastic substrates shrink after heating at elevated temperatures. Unlike thermal expansion, shrinkage is generally irreversible. Thermal expansion combined with shrinkage can therefore cause the article to curl significantly during the heating and cooling processes, which may pose significant challenges during manufacturing. The CTE mismatch between the plastic and the metal results in non-uniform gap between plastic substrate and metal electrode and causes non-uniform deposition, coating density, and deposition rate across the substrate surface.

Certain methods have been employed to address this problem. For example, mechanical methods exist in order to keep the polymeric substrate in good contact with the metallic electrode. However, such mechanical methods can require modifying deposition hardware, incurring extra time, labor, and processing costs.

Therefore, there exists a need for new approaches for achieving uniform film deposition or etching during processing.

BRIEF SUMMARY

Disclosed herein are plasma mediated deposition and/or etching methods of non-conductive substrates that exhibit improved uniformity. In one embodiment, a plasma mediated method for uniformly depositing or etching a non-conductive substrate comprises applying an electrically conductive coating onto the non-conductive substrate; and plasma processing the substrate by depositing a coating or etching a surface of the substrate, wherein coating or etching uniformity of the plasma mediated method increases relative to plasma processing the substrate without the electrically conductive coating.

In another embodiment, a plasma mediated method for uniformly depositing or etching a non-conductive substrate comprises applying an electrically conductive coating onto the non-conductive substrate; electrically connecting the electrically conductive coating on the non-conductive substrate to an electrode of a plasma apparatus; and forming a uniform potential during plasma processing on a surface of the non-conductive substrate.

In yet another embodiment, a plasma mediated method for depositing a conformal coating onto a non-conductive substrate process comprises providing a non-planar, non-conductive substrate with an electrically conductive coating; seating the non-planar, non-conductive substrate onto an electrode of an plasma deposition apparatus, wherein the conformal electrically conductive coating is in electrical communication with the electrode; and generating a plasma of reactive species and depositing a conformal coating from the reactive species onto the non-planar non-conductive substrate.

The features and advantages of the components and processes disclosed herein can be more readily understood by reference to the following drawings and detailed description, and the examples included therein.

BRIEF DESCRIPTION OF THE DRAWINGS

In the figures below, wherein like elements are numbered alike, are for illustrative purposes.

DETAILED DESCRIPTION

The present disclosure relates generally to thin film etching and deposition processes. More particularly, it relates to a method for improved uniformity in plasma deposition or etching of a thin film on a non-conductive substrate. Specifically, this disclosure provides for improved uniformity in plasma deposition or etching of a thin film on a non-conductive substrate by disposing a conductive layer on the substrate prior to plasma mediated processing. By disposing a conductive layer on the non-conductive substrate, a uniform electric potential created during plasma processing is built up on the non-conductive substrate, which is equivalent to that of the metallic electrode upon which it is disposed during plasma processing. The uniform potential electrically shields out any gaps formed between the substrate and electrode during processing, e.g., gaps formed as a result of thermal expansion of the non-conductive substrate during plasma processing. Subsequently, a uniform electric field is built across the substrate surface, which enables uniform deposition, or etching across the substrate.

Figure 1:
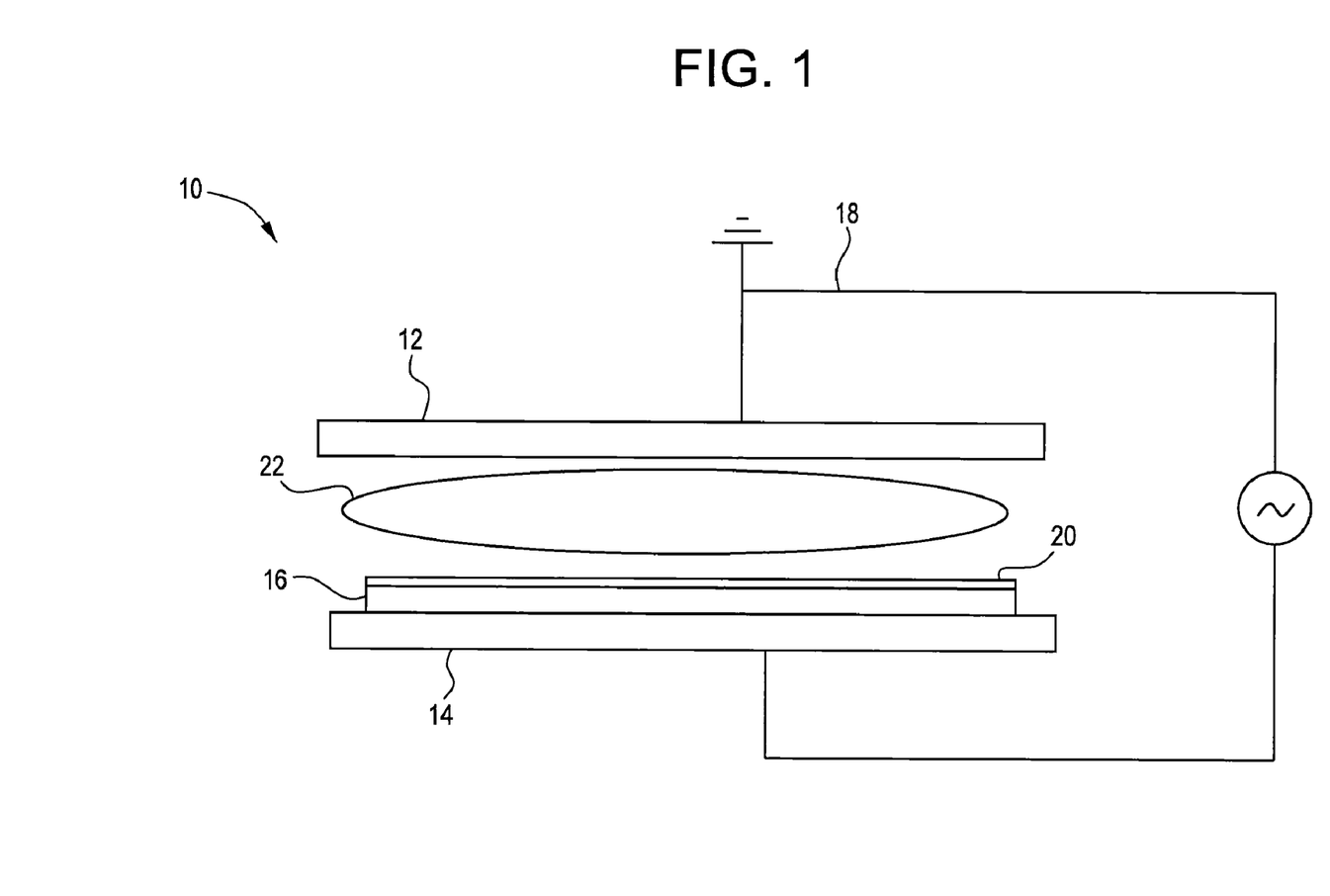
FIG. 1 is a simplified cross sectional view of a plasma reactor for thin film deposition and etching, wherein a non-conductive substrate is disposed between two electrodes of the reactor.

Referring now to the Figures, FIG. 1 shows an exemplary embodiment of a plasma reactor apparatus 10, which is not intended to be limiting for practicing the methods as described in the present disclosure. Other plasma etching or deposition apparatuses can be utilized as will be apparent to those skilled in the art in view of this disclosure. The apparatus generally includes a chamber having two opposing electrodes 12, 14 in electrical communication with a high energy source 18, e.g., a radiofrequency source, direct current, magnetic field, and the like. A non-conductive substrate 16 of a desired application is seated on electrodes 14. The non-conductive substrate includes a coating disposed thereon of a conductive material 20. An electric field is generated between the electrodes 12, 14 under pre-selected frequency and power conditions to ionize a gas mix, thereby forming plasma 22. Methods of generating an electric field between the electrodes are well-known in the art and therefore do not require an exhaustive description here.

Each of the electrodes 12, 14 has a planar face parallel to the other electrode. In one embodiment, the electrodes are horizontally arranged within the chamber, i.e., an upper electrode with a planar surface is facing a planar surface of a lower electrode. The spacing between the electrodes generally depends on the desired strength of the applied electric field, as well as the size of the substrate being coated or etched. Those skilled in the vapor deposition art appreciate the interrelationship of these processing variables and are therefore able to make adjustments for a particular use without undue experimentation.

During operation, the plasma 22 has a potential (Vp) and the metallic electrodes 12, 14 are either grounded or connected to the RF power generator, thus each has a potential (Ve). At the plasma boundary, which can be in the vicinity of substrate 16, electrons and ions will diffuse out of the plasma, owing to their thermal energies. Initially, the electron flux to the non-conductive substrate will be higher than the ion flux, due to the greater thermal velocities of the electrons. However, this will cause the plasma to become more positive, since there is an excess of positive ions left behind. An electric field will develop that will retard the electrons and accelerate the ions in such a way to make the net current zero. The magnitude of the potential that the plasma acquires is about (3kT'/e), where T' is the electron temperature. This potential falls off from the substrate into the plasma over a distance of the Debye length. At this point in time, the non-conductive substrate surface has a certain potential. Although there still may exist a non-uniform gap between the substrate and the metallic electrode, this gap is electrically shielded out by the presence of the conductive coating, which is in electrical communication with the metallic electrode. Therefore, a uniform electric potential is formed over the substrate surface, which will in turn create a uniform electric field between the now conductive substrate and plasma. The uniformity of the electric field correlates with the uniformity of coating or etching properties such as deposition rate and coating density, among other coating processing factors. Conversely, without the conductive coating of the present disclosure, the forming of a non-uniform gap between substrate and electrode would result in non-uniformity of the electric field, and likewise affect the ion and electron energies reaching the non-conductive substrate, yielding non-uniform results in coating or etching properties.

In some plasma deposition/etching apparatus, the plasma and the reactive species and ions formed therein are spaced apart from the substrate and transported to the substrate for deposition or etching.

Figure 2:
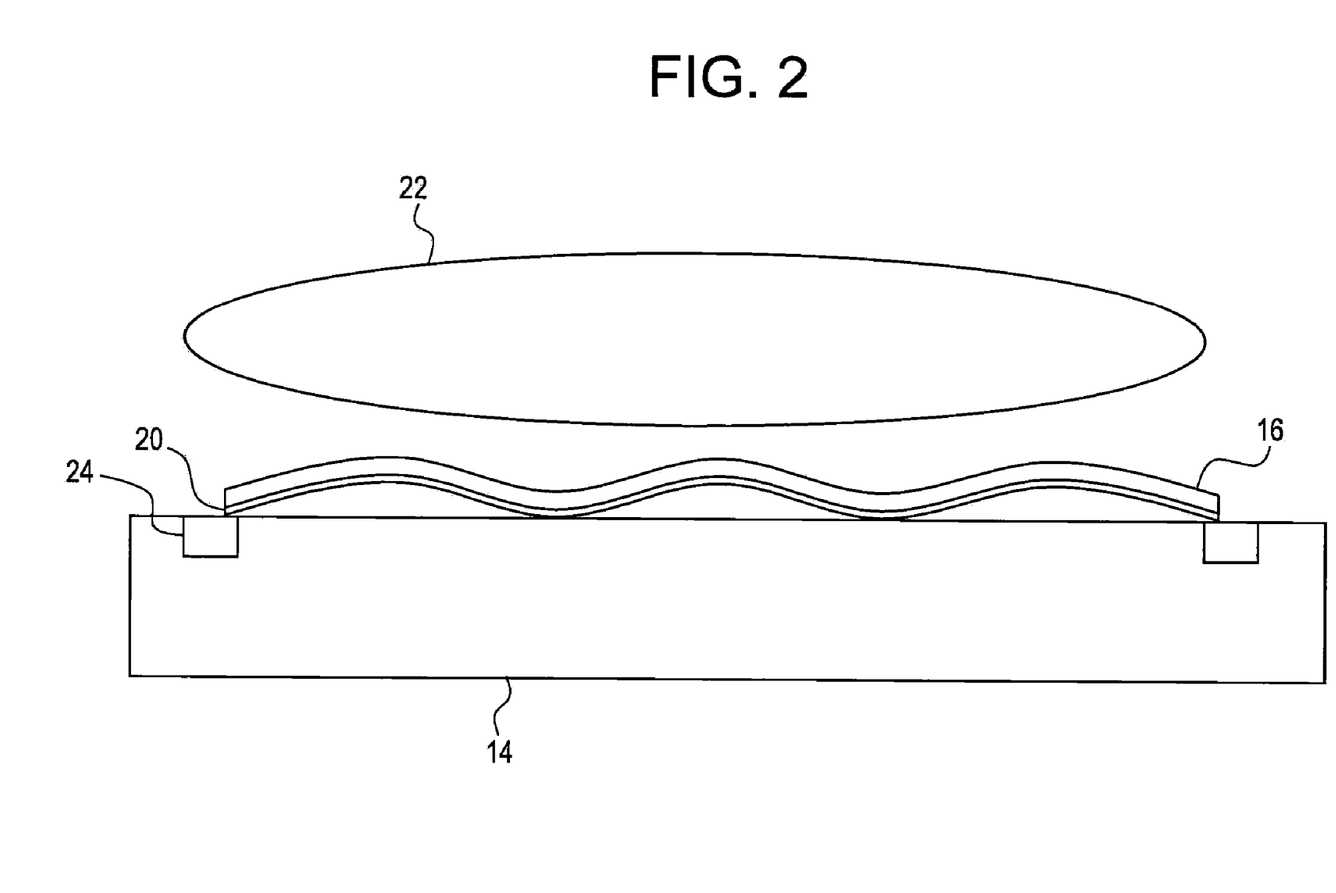
FIG. 2 is a cross sectional view of a non-conductive substrate seated on an electrode of a plasma reactor and attached thereto with a metallic frame.

FIG. 2 illustrates an exemplary embodiment of a polymeric substrate 16 with the conductive coating 20 of the present disclosure. The polymeric substrate 16 is seated on the metallic electrode 14 by attachment to a metallic frame 24 of electrode 14. As such, conductive coating 20 is in electrical communication with metallic electrode 14. The substrate 16 and electrode 14 are in operative communication with plasma 22, wherein generation of reactive species and ions takes place. In an exemplary embodiment, electric connection can be achieved simply by applying a copper tape with conductive adhesive to both conductive coating 20 and metallic electrode 14. Thus, conductive coating 20 forms a uniform potential on the polymeric substrate surface which is about equal to that of the metallic electrode 14, thereby electrically shielding any gap differences between substrate 16 and electrode 14 that may occur during processing. Thus, a uniform electrode field can be built across the polymeric substrate or film, which enables uniform coating deposition.

Alternatively, the conductive coating can also deposited on the substrate surface facing plasma 22. In yet another embodiment, the conductive coating can be deposited on both surfaces of the substrate. In still other embodiments, the conductive coating is pre-existing and is configured to be in electrical communication with the electrode by direct or indirect contact (e.g., conductive tape) with the electrode.

Figure 3:
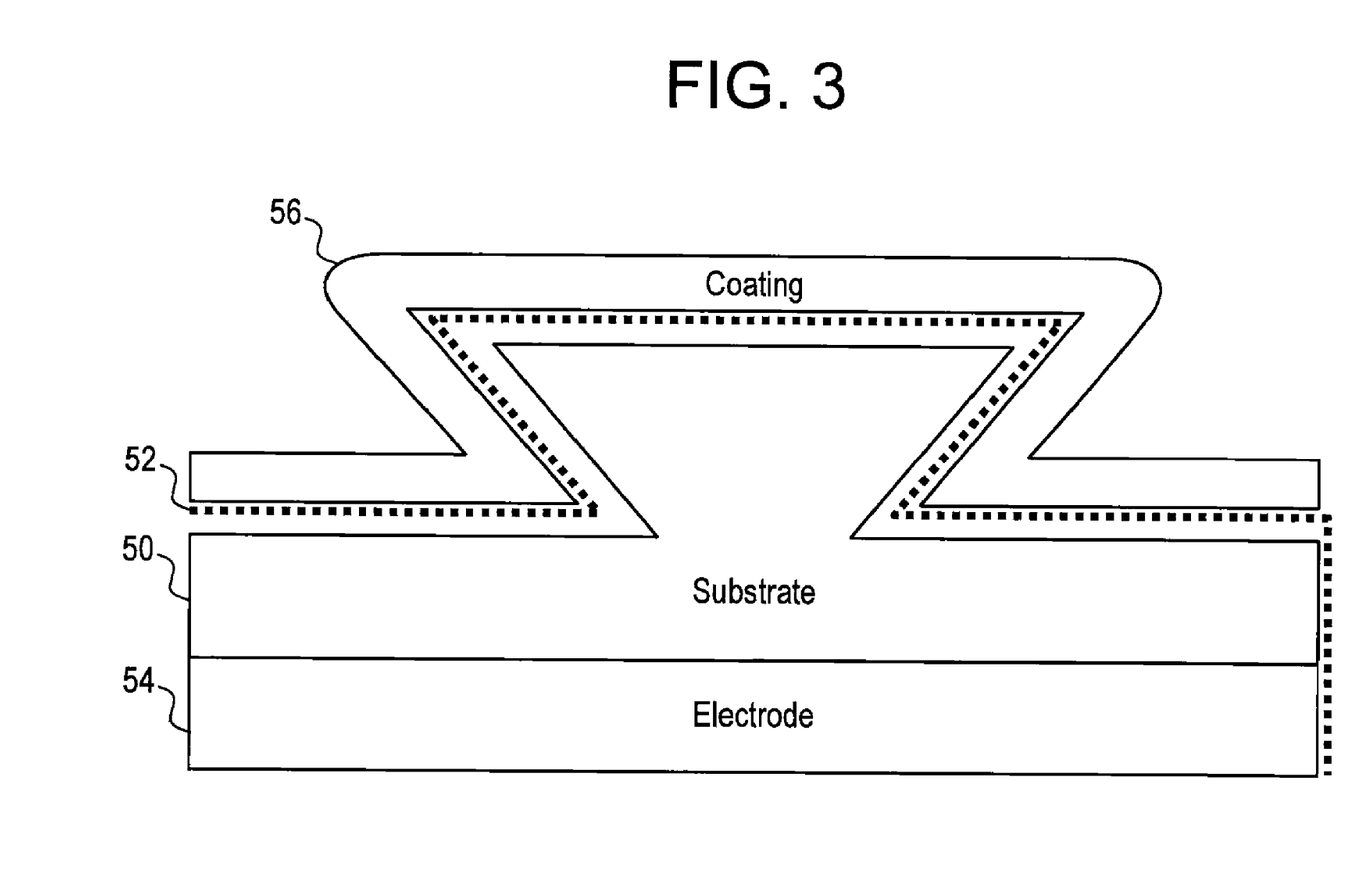
FIG. 3 is a cross sectional view of a conductive coating conformally disposed on a non-conductive substrate.

FIG. 3 illustrates another embodiment of a non-conductive polymeric substrate 50 provided with a conformally deposited conductive coating 52, which is in electrical communication with an underlying electrode 54 upon which the non-conductive substrate is seated. Because of the electrical communication between the conductive coating 52 and the metallic electrode 54, the conductive coating 52 forms a uniform potential across the surface of the substrate 50, which is about equal to that of the metallic electrode 54. As such, during deposition (or etching) electrically charged species will now be attracted to the varied topography of the substrate surface, if present, which results in a coating 56 (or etching) that is more conformal, uniform, and continuous. Without the presence of the conductive coating in electrical communication with the electrode, coating deposition (or etching) on a substrate exhibiting varied topography would be non-conformal, non-uniform, and possibly discontinuous since the electrically charged species would be attracted to the planar electrode underlying the substrate, i.e., would provide "line of sight" type deposition or etching.

Establishing electrical communication between the conductive coating and the electrode is not intended to be limited in any manner. By way of example, the conductive coating can be deposited such that it is in direct contact with the electrode. Alternatively, indirect contact can be made by use of conductive tape to provide electrical communication between the conductive coating the electrode. Additionally, it should be noted that the conductive coating can be electrically isolated from the surface of the substrate as may be desired or different applications. For example, one or more insulating coatings can be disposed before and/or after the conductive coating.

The conductive coating can be any suitable electrically conductive coating. The conductive coating can be either transparent or opaque. Exemplary transparent conductive coating material includes, without limitation, indium oxide, tin oxide, zinc oxide, gallium oxide, cadmium oxide, and combinations of the foregoing. Other examples of transparent conductive coating are coatings formed from carbon nanotube or very thin metal coatings. Opaque conductive coating can be selected from a variety of metal film including, but not limited to, silver, gold, platinum, copper, aluminum, tungsten, titanium, nickel, zirconium, molybdenum, palladium, zinc, tantalum, indium, tin, and combinations of the foregoing. Other form of conductive coatings include conductive polymer coating, polymer coating with conductive particles, dielectric coating with embedded conductive particles, dielectric coating sandwiched with metallic coating, etc.

The particular non-conductive substrate employed will generally depend on the desired application, however, the disclosure is particularly suited to substrates wherein the coefficient of thermal expansion of the substrate does not equal the coefficient of thermal expansion of either electrode 14 employed, the layers that may applied or removed in the deposition or etching process, or both. The substrate can be a homogeneous mixture of materials, a composite of materials, or multiple layers of materials. The substrate can either be light transmissive or opaque, depending on the intended application. Likewise, the conductive coating can be either rigid or flexible depending on the intended application. In one embodiment, the substrate is a polymer. In an exemplary embodiment, the substrate is a polycarbonate film. Other examples of polymeric substrate include polyethylene terephthalate (PET) film, polyethylene naphthalate (PEN) film, polyethersulfone (PES) film, polyimide (PI) film, copolymers thereof, and the like. This disclosure can also be suited to curve a rigid substrate, such as a curled glass sheet that cannot form a uniform gap with flat metallic electrode.

One advantage of the present disclosure is that the method can improve coating uniformity without modifying existing deposition hardware. The method of depositing the conductive coating can be carried out by any suitable plasma deposition method using any suitable plasma deposition apparatus. The disclosed method can be applied to any suitable plasma etching or deposition apparatus including, but not limited to, plasma enhanced chemical vapor deposition (PECVD), plasma assisted evaporation, plasma assisted atomic layer deposition (ALD), reactive ion etching (RIE), and the like. In one embodiment, the method of conductive coating deposition can be executed in batch process apparatus, where the substrate is loaded one piece each time; in another embodiment the method of conductive coating deposition can be executed in a roll-to-roll reactor, where the substrate is processed in continuous mode.

Another advantage of the disclosed method is that once the conductive coating is applied, any plasma mediated process can be employed. During deposition, materials are deposited onto the substrate surface. For example, deposited layers of silicon, silicon dioxide, silicon nitride, metals and the like may be formed on the surface of the substrate. Conversely, etching may be employed to selectively remove materials from predefined areas on the substrate surface. For example, etched features such as vias, contacts, or trenches may be formed in the layers of the substrate. The suitable plasma assisted process employed will be determined based on the desired application.

Still further, the disclosure provides a method for improving coating or etching uniformity of substrates having variable topography, i.e., topography that does not mirror the electrode surface. For example, patterned substrates can be used as well as substrates disposed on cylindrical electrode surfaces. The plasma deposited coating is not intended to be limited. Exemplary coatings include, without limitation, silicon oxide, silicon nitride, silicon oxynitride, silicon oxycarbide, or combinations thereof.

The following examples fall within the scope of, and serve to exemplify, the more generally described methods set forth above. The examples are presented for illustrative purposes only, and are not intended to limit the scope of the disclosure.

Example 1

Figure 4:
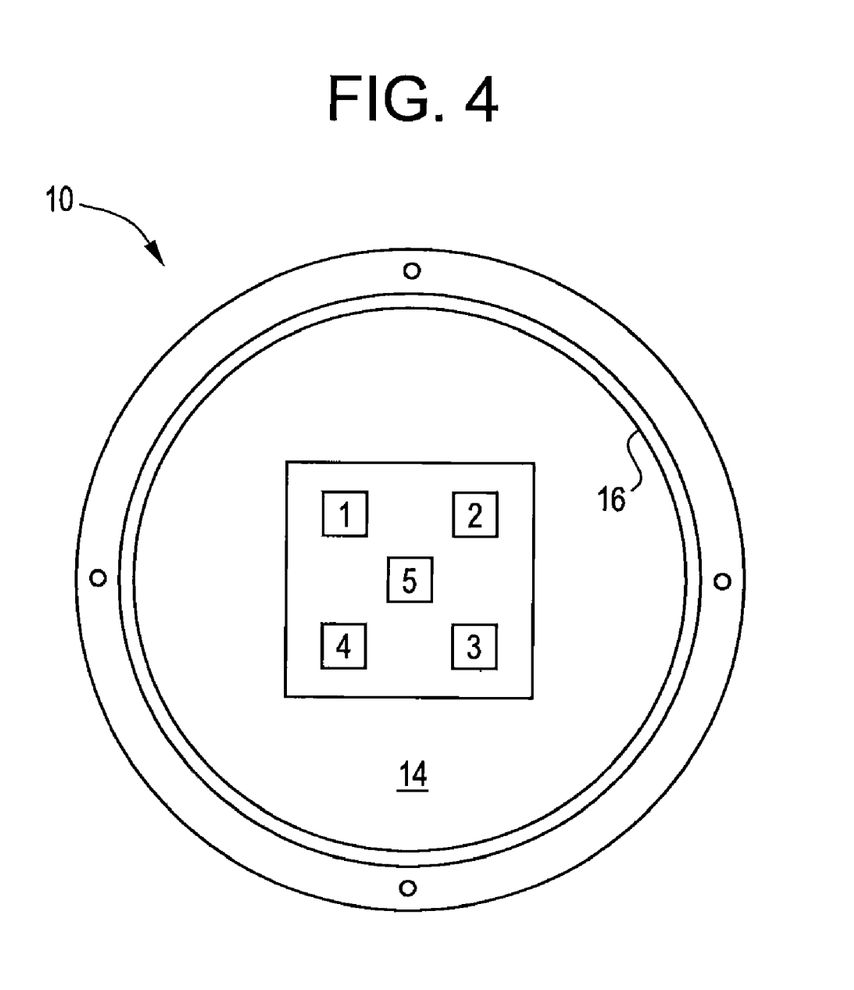
FIG. 4 illustrates different locations utilized for measuring silicon oxynitride coating thickness deposited in a plasma reactor.

In this example, coating uniformity of a silicone oxynitride film deposited onto a non-conductive substrate by plasma enhanced chemical vapor deposition was measured for substrates having a conductive coating and for substrates that did not contain the conductive coating. The non-conductive substrate was a polycarbonate resin thermoplastic film, "the substrate", commercially available from the Sabic Innovative Plastics, Inc. under the trade name Lexan, having a thickness of 5 mil (125 µm) was mounted on one side to a metallic frame. One substrate was further coated with indium tin oxide (ITO) at a thickness of 20 nanometers and a sheet resistance of 300 ohms/square. The ITO coating was on the backside of the Lexan film, i.e., coated on surface that will be in direct contact with the electrode and also the surface in which the metallic frame was mounted. The silicon oxynitride coatings were deposited onto the substrates in a PECVD reactor (PlasmaTherm model 790). The ITO coated substrate was electrically connected to the electrode by applying a copper tape with a conductive adhesive on both ITO coating and the electrode. Both substrates were exposed to similar process conditions for coating the silicon oxy-nitride. The deposition process was carried out for 2 minutes. The thickness of the coating deposited was measured at five different points on a substrate sample as is generally shown in FIG. 4. The average was calculated and the percent variation of thickness at the five measured locations was determined. The results are shown in Tables 1 and 2 below.

TABLE 1

WITHOUT CONDUCTIVE COATING

| Location | Thickness (nm) | Deposition Rate (nm/min) |
|---|---|---|
| 1 | 54.47 | 27.24 |
| 2 | 48.37 | 24.19 |
| 3 | 56.27 | 28.13 |
| 4 | 57.74 | 28.87 |
| 5 | 79.94 | 39.97 |
| Average | 59.36 | 29.68 |
| Standard Deviation | 12.04 | 6.02 |
| Variation (%) | 20.29 | 20.29 |

TABLE 2

WITH CONDUCTIVE COATING

| Location | Thickness (nm) | Deposition Rate (nm/min) |
|---|---|---|
| 1 | 61.96 | 30.98 |
| 2 | 62.15 | 31.08 |
| 3 | 61.53 | 30.77 |
| 4 | 60.33 | 30.17 |

TABLE 2-continued

WITH CONDUCTIVE COATING

| Location | Thickness (nm) | Deposition Rate (nm/min) |
|---|---|---|
| 5 | 64.42 | 32.21 |
| Average | 62.08 | 31.04 |
| Standard Deviation | 1.49 | 0.74 |
| Variation (%) | 2.39 | 2.39 |

The results show that the coating non-uniformity of $SiO_xN_y$ was dramatically reduced from about 20% on the film without the conductive coating to about 2% on the film with the conductive coating. The results demonstrate the advantages of the conductive coating of the present disclosure in ensuring uniform deposition or etching of a coating on a substrate. If the process is highly uniform, for example, it is expected that the process rates at different points on the substrate, as well as process rates between different substrates in a production run, tend to be substantially equal. In either case, it is less likely that one area of the substrate will be unduly over-processed while other areas remain inadequately processed or that one substrate will be processed differently than another substrate. As can be appreciated, process uniformity is an important determinant of yield and therefore a high level of process uniformity tends to translate into lower costs for the manufacturer.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A plasma mediated method for uniformly depositing or etching a non-conductive substrate, the method comprising:
    depositing by plasma processing an electrically conductive coating onto the non-conductive substrate;
    electrically connecting the electrically conductive coating on the non-conductive substrate to an electrode of a plasma apparatus; and
    plasma processing the substrate by depositing a coating or etching a surface of the substrate, wherein the substrate has a coating or etching uniformity that increases relative to plasma processing the substrate without the electrically conductive coating.

2. The method of claim 1, wherein the electrically conductive coating is a metal, a metal oxide, a conductive polymer, or a combination of the foregoing.

3. The method of claim 1, wherein the electrically conductive coating comprises indium oxide, tin oxide, zinc oxide, gallium oxide, cadmium oxide, carbon nanotube material, silver, gold, platinum, copper, and combinations of the foregoing.

4. The method of claim 1, wherein the plasma processing of the substrate comprises a plasma enhanced chemical vapor deposition process, a plasma assisted evaporation process, a plasma assisted atomic layer deposition process, or a reactive ion etching process.

5. The method of claim 1, wherein the substrate is a polymeric thin film.

6. The method of claim 1, wherein the coating comprises silicon oxide, silicon nitride, silicon oxynitride, silicon oxycarbide, or combinations thereof.

7. The method of claim 1, wherein the substrate comprises a polycarbonate, a polyimide, polyethylene terephthalate, a polyethylene naphthalate, a polyethersulfone, copolymers thereof, or combinations of the foregoing.

8. The method of claim 1, wherein providing the electrically conductive coating onto the non-conductive substrate comprises applying the electrically conductive coating to a selected one of a top side surface, a bottom side surface or both the top and bottom side surfaces.

9. The method of claim 1, wherein the electrically conductive coating is transparent.

10. The method of claim 1, wherein the electrically conductive coating is opaque.

11. A plasma mediated method for uniformly depositing or etching a non-conductive substrate, the method comprising:
    depositing by plasma processing an electrically conductive coating onto the non-conductive substrate;
    electrically connecting the electrically conductive coating on the non-conductive substrate to an electrode of a plasma apparatus; and
    forming a uniform potential during plasma processing on a surface of the non-conductive substrate.

12. The method of claim 11, wherein plasma processing the non-conductive substrate comprises depositing a coating onto the substrate or etching a surface of the substrate, wherein the substrate has a coating or etching uniformity that increases relative to plasma processing the substrate without the electrically conductive coating.

13. The method of claim 11, wherein the electrically conductive coating is a metal, a metal oxide, a conductive polymer, or a combination of the foregoing.

14. The method of claim 11, wherein the electrically conductive coating comprises indium oxide, tin oxide, zinc oxide, gallium oxide, cadmium oxide, carbon nanotube material, silver, gold, platinum, copper, and combinations of the foregoing.

15. The method of claim 11, wherein the plasma processing the substrate comprises a plasma enhanced chemical vapor deposition process, a plasma assisted evaporation process, a plasma assisted atomic layer deposition process, or a reactive ion etching process.

16. The method of claim 11, wherein the substrate comprises a polycarbonate, a polyimide, polyethylene terephthalate, a polyethylene naphthalate, a polyethersulfone, copolymers thereof, or combinations of the foregoing.

17. The method of claim 11, wherein the electrically conductive coating is transparent.

18. A plasma mediated method for depositing a conformal coating onto a non-conductive substrate, the process comprising:
    depositing by plasma processing a conformal electrically conductive coating on a non-planar, non-conductive substrate;
    seating the non-planar, non-conductive substrate onto an electrode of a plasma deposition apparatus, wherein the conformal electrically conductive coating is in electrical communication with the electrode; and generating a plasma of reactive species and depositing a conformal coating from the reactive species onto the non-planar non-conductive substrate.

19. The plasma mediated method of claim 18, wherein the non-planar, non-conductive substrate further comprises one or more insulating layers intermediate the substrate and the conformal coating and/or the electrode and the conformal electrically conductive coating.

20. The plasma mediated method of claim 18, wherein the conformal electrically conductive coating comprises indium oxide, tin oxide, zinc oxide, gallium oxide, cadmium oxide, carbon nanotube material, silver, gold, platinum, copper, and combinations of the foregoing.

21. The plasma mediated method of claim 18, wherein the substrate comprises a polycarbonate, a polyimide, polyethylene terephthalate, a polyethylene naphthalate, a polyethersulfone, copolymers thereof, or combinations of the foregoing.

22. The plasma mediated method of claim 18, wherein seating the non-planar, non-conductive substrate onto an electrode of a plasma deposition apparatus provides direct contact of the conformal electrically conductive coating with the electrode.

23. The plasma mediated method of claim 18, wherein the non-planar, non-conductive substrate is flexible.

* * * * *